United States Patent [19]

Rostoker

[11] Patent Number: 5,386,342
[45] Date of Patent: Jan. 31, 1995

[54] RIGID BACKPLANE FORMED FROM A MOISTURE RESISTANT INSULATIVE MATERIAL USED TO PROTECT A SEMICONDUCTOR DEVICE

[75] Inventor: Michael Rostoker, San Jose, Calif.

[73] Assignee: LSI Logic Corporation, Milpitas, Calif.

[21] Appl. No.: 173,494

[22] Filed: Dec. 23, 1993

Related U.S. Application Data

[63] Continuation of Ser. No. 829,977, Jan. 30, 1992, abandoned.

[51] Int. Cl.⁶ .......................... H05K 1/00; H05K 7/02
[52] U.S. Cl. ........................ 361/749; 174/52.2;
174/52.3; 174/254; 174/252; 257/668; 257/790;
361/807; 361/809; 361/707; 361/750; 439/67;
439/77; 439/485
[58] Field of Search ........ 174/252, 254, 255, 256–258,
174/260, 268, 52.2, 52.3; 361/748, 749, 751,
760, 761, 807, 809, 707, 719, 720; 439/68, 67,
77, 485; 257/711, 712, 790, 668

[56] References Cited

U.S. PATENT DOCUMENTS

| | | | |
|---|---|---|---|
| 3,676,569 | 7/1972 | Thompson | 174/52 |
| 3,950,142 | 4/1976 | Brenan et al. | 29/191 |
| 4,105,861 | 8/1978 | Hascoe | 174/52 |
| 4,495,546 | 1/1985 | Nakamura et al. | 361/398 |
| 4,709,122 | 10/1987 | Samuels | 174/52 |
| 4,792,843 | 12/1988 | Haghiri-Tehrani et al. | 357/72 |
| 4,800,419 | 1/1989 | Long et al. | 357/70 |
| 4,814,943 | 3/1989 | Okuaki | 361/400 |
| 4,843,225 | 6/1989 | Hoppe | 235/492 |
| 4,985,748 | 1/1991 | Belanger, Jr. | 357/69 |
| 4,990,719 | 2/1991 | Wright | 174/524 |
| 5,041,395 | 8/1991 | Steffen | 357/70 |
| 5,239,448 | 8/1993 | Perkins et al. | 439/91 |

FOREIGN PATENT DOCUMENTS

| | | | |
|---|---|---|---|
| 3302857 | 8/1984 | Germany | 361/398 |
| 64-64389 | 3/1989 | Japan | 439/77 |
| 1-161840 | 6/1989 | Japan | 361/749 |
| 5-67641 | 3/1993 | Japan | 361/761 |
| WO89/04552 | 5/1989 | WIPO | 174/52.2 |

OTHER PUBLICATIONS

Computer Search Results (Compilation, not published).
Olin Portfolio (Compilation, not published).

Primary Examiner—Leo P. Picard
Assistant Examiner—Donald A. Sparks
Attorney, Agent, or Firm—Honigman Miller Schwartz and Cohn

[57] ABSTRACT

An integrated circuit device package of this invention includes a flexible substrate having an upper patterned insulative layer, and a lower patterned conductive layer including a plurality of package leads. An integrated circuit die is fixed within a void of the upper surface of the flexible substrate, and is provided with electrical connections to the package leads. A rigid upper protective layer is provided to substantially enclose the integrated circuit die, and at least partially cover the top surface of the upper insulative layer. The integrated circuit device package further comprises a rigid or semi-rigid lower protective layer opposite the upper protective layer. The rigid lower protective layer is preformed, and preferably is made from a material selected from the group consisting of rigid ceramic, glass, plastic, and combinations thereof. The combination of upper and lower protective layers fore a device package which provides enhanced protection from mechanical and electrical degradation of the packaged device; from injury due to environmental, shipping and handling, storage; and from use conditions. Methods of production are also given.

12 Claims, 3 Drawing Sheets

RIGID BACKPLANE FORMED FROM A MOISTURE RESISTANT INSULATIVE MATERIAL USED TO PROTECT A SEMICONDUCTOR DEVICE

This application is a continuation of application Ser. No. 07/829,977, filed Jan. 30, 1992, now abandoned and related to application Ser. No. 07/828,468 now pending.

TECHNICAL FIELD

This invention relates to semiconductor device packages, and methods for making such packages.

BACKGROUND OF THE INVENTION

Advances in integrated circuit technology allow a single integrated circuit to perform functions that previously required multiple integrated circuits. As size parameters have decreased, semiconductor devices have gone through many iterations reducing the size of the semiconductor building block, the transistor. As little as ten years ago, transistor dimensions in the range of 3 to 5 microns were standard. Today, the semiconductor industry is attaining transistor dimensions of 0.5 to 0.7 microns. Paralleling the decrease in size of transistor dimension is the increase in the number of individual transistors that occupy a single semiconductor integrated circuit die. Ten years ago transistor densities in the range of 5,000 per die were possible. Today, chips containing 200,000 transistors per die are in production.

To use the many integrated circuits on a semiconductor die, the semiconductor die must communicate with the environment in which the packaged chip is used. One such environment is a circuit board, which may contain one or more packaged integrated circuit chips, and one or more discrete circuit elements, which are connected electrically. Semiconductor devices communicate by accepting electrical impulses supplied by an external circuit (as on a circuit board) connected to the chip, conducting those impulses to electrical circuits contained on the die, and reacting to those input impulses in a predetermined manner to generate electrical impulses that are then output from the chip to the external circuit (e.g., on the circuit board). The input and output of electrical impulses to the semiconductor chip occur over electrically conducting material, commonly referred to as leads. As transistor density has increased in each generation of semiconductor devices, so has the need to increase the number of leads available for connection to and from the semiconductor device. Non-semiconductor integrated circuit devices, such as optical and superconductive devices, may also require high lead count packages.

Competing industry requirements of small semiconductor die size and large semiconductor lead counts has caused semiconductor manufacturers to develop new package devices. U.S. Pat. No. 4,800,419 discloses a support assembly that provides for closely spaced leads with fine definition. These leads are created on a tape-like structure using photolithography and/or etching processes. The semiconductor device package includes a flexible substrate having an upper patterned insulative layer, and a lower patterned metal layer including a multiplicity of package leads. An integrated circuit die is fixed to the upper surface of the flexible substrate. A rigid upper protective layer which partially encloses the integrated circuit and at least partially covers the top surface of the upper insulative layer is present. A lower flexible diaphram is attached next to the lower patterned metal layer opposite the rigid upper protective layer, and acts as a flexible wall to protect the lower patterned metal layer. In combination with the other elements, the lower flexible diaphram acts to enclose the integrated circuit die. The integrated circuit chip package has a multiplicity of electrical leads which provide electrical connections between the integrated circuit die and the package leads.

The packaging method of U.S. Pat. No. 4,800,419 maintains rigidity of the closely spaced, finely defined leads during the package assembly phase by providing an external support member around the perimeter of the package. However, afar the integrated circuit package assembly is complete the external support member is removed to allow installation into an external circuit. This leaves the rigid upper protective layer protecting the integrated circuit die, and the flexible diaphram providing support and protection for the lead assembly. It has been found that the lead assembly can be subject to injury. Delamination of the diaphram from the leads, and of the leads from the tape-like structure, can occur, as can lead deterioration in the form of cracking and separating. These problems are caused, for example, by moisture, or by flexing of the tape-like structure and diaphram supporting the package, especially during handling, transport or installation of the package.

SUMMARY OF THE INVENTION

An integrated circuit device package of this invention includes a flexible substrate having an upper patterned insulative layer, and a lower patterned conductive layer including a plurality of package leads. An integrated circuit die is fixed at the upper surface of the flexible substrate. A plurality of electrical leads are used to provide electrical connections between the integrated circuit die and the package leads. A rigid upper protective layer is present and at least partially encloses the integrated circuit chip, and covers at least a portion of the top surface of the upper insulative layer.

The integrated circuit device package further comprises a rigid or semi-rigid lower protective layer opposite the upper protective layer. The rigid lower protective layer is pre-formed, and is preferably made of one or more materials selected from the group consisting of rigid ceramic, glass, plastic, and combinations thereof.

The rigid lower layer provides enhanced protection to the lower side of the package, and protects from delamination of the package. It also provides a barrier to protect the chip and leads from the incursion of water or moisture, and provides enhanced physical protection of the leads during shipping and transport. The rigid lower protective layer may also function as a heatsink. The rigid lower layer is bonded to the rigid upper protective layer, for example, through a cutout pattern within the flexible substrate. The rigid lower layer can also be adhered to the patterned metal layer of the flexible substrate. The protective rigid lower and upper layers form a unit which substantially encloses and protects the integrated circuit die, while permitting electrical connection between the integrated circuit die and the external environment.

DISCLOSURE OF THE INVENTION INCLUDING BEST MODE

The Figures are drawn for clarity and are not drawn to scale. Similar numbers refer to similar structures throughout the Figures.

Figure 1:
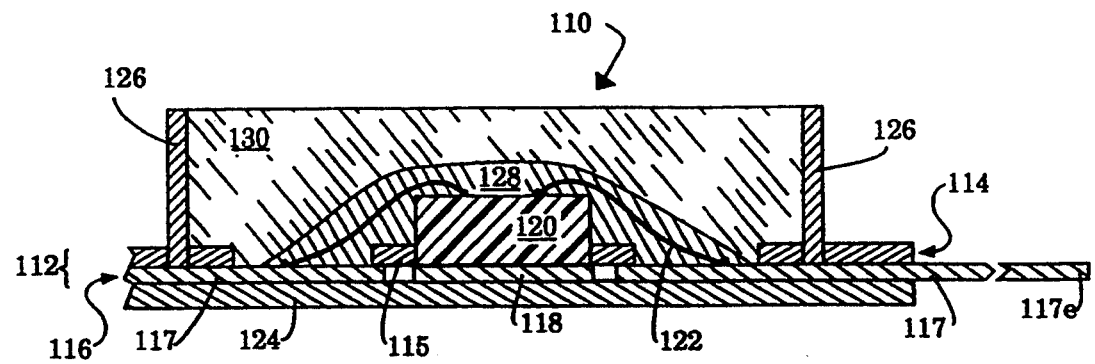
FIG. 1 shows a cross-sectional representation of a wire-bond integrated circuit package of this invention.

As shown in FIG. 1, a semiconductor device package of this invention 110 includes a flexible substrate 112 having an upper patterned insulative layer 114, and a lower patterned conductive layer 116 including a plurality of electrical leads 117. The materials of this tape are preferably selected to withstand mechanical, thermal, chemical and electrical stresses associated with later processing, qualification testing, storage and transport, and use.

The flexible substrate 112 can be of various forms to provide suitable electrical connection. Two- and multiple-layered flexible substrates which are appropriate for use herein are well known in the art and are available from, for example, Shindo Co. (Japan), 3M (Minnesota), and Mitsui Metal Mining Co. (Japan). flexible substrates which are appropriate are sold as "two-layer" and "three-layer" tapes. Generally, "two-layer" tape has a patterned metal layer bonded directly to a patterned insulative layer. The examples used herein generally refer to two-layer tapes. "Three-layer" tape has a patterned metal layer bonded to a patterned insulative layer with an Lutemediate adhesive layer. Common flexible substrates can conveniently be either "wire bondable" tape or "tape automated bonding" (TAB) tape, but other fores of electrical connection between die and leads are also contemplated.

The upper patterned insulative layer 114 is generality made of a flexible insulative material. Thermoset and other plastics, such as epoxies, can be used. Durable polyimide plastics are preferable for use. One example of such a polyimide is Kapton TM (Dupont Chemicals). An alternate polymide is Upilex TM (UPI, Japan, available through Shindo Denshi, Japan). In a preferred embodiment, the upper insulative layer is pre-made to conform to the physical layout of photographic film stock. Perforations along the edge of the film stock allow for easy automation and handling of the flexible substrate.

The upper patterned insulative layer 114 does not form a continuous surface, but rather is patterned with voids and planes of different shapes and sizes to provide a combination of conductive regions (encompassing a void through which the conductive layer is accessible) and insulative regions (encompassing a surface which insulates and isolates the conductive layer). The patterned insulative layer generally has a thickness of from less than about 2 mil to more than about 5 rail, and more preferably from about 3 rail to about 5 rail.

The lower patterned conductive layer 116 is made of a conductive material, generally a metal. The metal used will depend upon the desired conductive attributes and the cost. Copper, gold, nickel, lead, tin, and gold-covered copper leads are especially appropriate. The patterned conductive layer 116 is patterned to provide electrical leads 117 and, if appropriate, a die attach pad 118. When a die attach pad 118 is present, the upper patterned insulative layer 114 includes a surface 115 which "bridges" between the die attach pad 118 and the electrical leads 117.

The lower patterned conductive layer 116 includes a die attach pad 118 upon which an integrated circuit die 120 is positioned. The integrated circuit die 120 is generally derived of materials including semiconductive materials (such as integrated circuit dies used in computer and semiconductor technologies). However, any complex circuit device requiring more than two external signal or source/power contacts to the internal complex circuit can be substituted herein. Examples of such alternate circuit devices include optical circuitry with either optical or electrical leads, and circuit devices including superconductive materials. The term "integrated circuit" is used herein to refer to any internal complex circuit devices. The term "electrical leads" includes non-electrically conductive lead devices, such as fiber optical filaments for an optical circuit device, as long as the leads transmit signals or power to or from the integrated circuit device. Obviously, should an optical circuit device "die" be used in the package of the present invention, it may be more suitable to have light insulative and conductive means, and such is included in the definition of "electrically" insulative and conductive materials.

A plurality of electrical leads 117 extend between the periphery of the die attach pad 118 and the periphery of the completed package 110. At or surrounding the periphery of the die attach pad 118, the electrical leads 117 are connected to the integrated circuit die 120. When the integrated circuit die 120 is electrically connected using wire bonding, a plurality of thin conductive wires 122 are positioned between circuit output locations on the integrated circuit die 120 and the electrical leads 117 of the flexible substrate 112 to provide the electrical connection between the circuits on the die 120 and the periphery of the package 110. The outermost edges of the electrical leads 117 are referred to as the "package leads" 117e, and these provide the connection between the completed integrated circuit chip package 110 and the environment in which the integrated circuit chip finds its ultimate use.

The integrated circuit die 120 is positioned and generally mechanically fixed to the die attach pad 118 using, for example, a metal-filled epoxy (not shown). Such means for attaching the integrated circuit die 120 to the die attach pad 118 may also provide electrical connection between the die 120 and the die attach pad 118, as is well known in the art.

The specific configuration of electrical circuits on the integrated circuit die 120 is not critical to the packaging device and methods herein, as long as locations on the die 120 are designated for electrical connection to the circuits on the die 120. These locations on the die 120 will be electrically connected to the leads 117 of the conductive layer 116 as described herein. The specific embodiment of the upper patterned insulative layer 114 and lower patterned conductive layer 116 which comprise the flexible substrate 112 will vary with the integrated circuit die 120, its intended use, and the method of affixing the integrated circuit die to the flexible substrate 112. Such variations are well within the range of accepted parameters for general integrated circuit chip packaging technology.

It is an advantage of the invention herein that a relatively large number of package connections are available in a relatively small package and at a reasonably low cost. For example, an integrated circuit package 110 for a silicon based semiconductor die having 164 package leads 117e can be manufactured with a lead pitch of 0.025 inches and a finished package width of 1.260 inches. The number of package leads 117e can be increased such that a package having 524 package leads can be manufactured with a lead pitch of 0.010 inches and a finished package width of 1.600 inches. Package leads numbering above or below those given can be readily manufactured by those knowledgeable in the art according to the teachings herein.

The flexible substrate 112 generally includes a number of voids where both the upper patterned insulative layer 114 and the lower patterned conductive layer 116 have gaps. To provide an enclosed substrate surrounding the integrated circuit die 120, the prior art generally included a flexible tape diaphram or epoxy layer diaphram (not shown) opposite the rigid upper layer. Such a flexible diaphram layer has several disadvantages. During processing, the flexible diaphram layer tends to bow downwardly due to the weight of the materials used to form the rigid upper protective layer. Such downward bowing is undesirable as it can interfere with later board mounting, in which the package diaphram layer must lie flat against the surface of a printed circuit board. Prior art flexible diaphram layers also tend to delaminate upon storage or transport, as well as in use, which can compromise the integrity of the electrical leads and expose the die 120 to external environmental conditions. The materials used to form the flexible diaphram layer of the prior art are not waterproof, and the presence of moisture in the environment can cause corruption of the packaged integrated circuit or its electrical leads, with catastrophic results.

Figure 2:
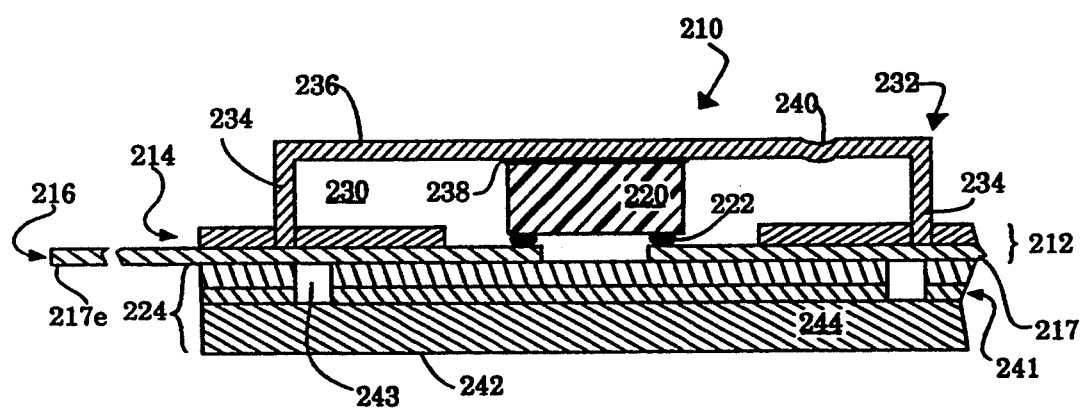
FIG. 2 shows a cross-sectional representation of a tape-automated bond integrated circuit package of this invention.

The rigid backplane 124 of the present invention functions, as the prior art flexible diaphram does, to enclose an area surrounding the integrated circuit die 120. The rigid backplane 124 is generally fixed to the perimeter of the rigid upper protective layer (described below) through the cutout pattern voids of the flexible substrate. Together with the rigid upper protective layer, the rigid backplane 124 functions to provide an enclosed space which can be filled (as shown in FIG. 1), partially filled (not shown), or left empty (as shown in FIG. 2). The rigid backplane 124 further functions to provide additional rigidity and protection for the package.

The rigid backplane 124 can be made of any appropriate rigid or semi-rigid material. Appropriate materials include ceramics, glass, and rigid plastics, and combinations thereof. The rigid backplane 124 can also function as an electrical ground, or as a heatsink, if desired. The rigid backplane 124 can also be composed of multiple layers, as further described in reference to FIG. 2.

Ceramic materials which are appropriate for use in the rigid backplane 124 include glass and other ceramics. Ceramics include beryllium oxide or aluminum nitrate. Other ceramic materials which can be used are known to the art, and are listed, for example, in Kirk and Othiner Encyclopedia of Chemical Technology (Interscience). The rigid backplane 124 can comprise one or more layers of rigid plastic or polymer. Thermoset plastics, for example, can be preformed and adhered to comprise the rigid backplane 124.

The rigid backplane 124 can have any desired perimeter shape. It is preferred that the rigid backplane 124 be substantially square or rectangular in shape, and that it closely approximate the shape of the rigid upper protective layer. The rigid backplane 124 is generally from about less than 10 mils to about $\frac{1}{4}$ inch in thickness. Generally, it is preferable to minimize the thickness of the rigid backplane 124, while still providing rigidity and protective characteristics. The minimum thickness will vary with the specific material used to fore the rigid backplane 124. However, it is generally preferable that the package height, and the backplane thickness, be minimized so that the packaging does not interfere with placement of the integrated circuit into its ultimate environment of use.

The rigid upper protective layer shown in FIG. 1 includes a dam member 126 and a silicone gel 128 which covers the integrated circuit die 120 and conductive wires 122, and partially fills the space enclosed by the dam member 126. A potting mixture 130 fills the remainder of the space enclosed by the dam member 126.

The upper patterned insulative layer 114 generally includes an annular (preferably square) voided area through which the dam member 126 is fitted and adhered. The dam member 126 is affixed using an adhesive such as a B-stage adhesive. RT-4B (RJR Polymers) is appropriate for this use. The dam member 126 can be made, for example, of resin, or ceramic. Ceramics include beryllium oxide or aluminum nitrate. The dam member 126 can be made of Ryton (Phillips Petroleum Co.). It is preferred that the thermal expansion characteristics of the dam member 126 be closely matched to the thermal expansion characteristics of the remainder of the package, and especially to the lower patterned conductive layer 116, and to the rigid backplane layer 124.

When a wire bond assembly is used it is common to include a silicone gel 128 to cover and protect the wire bond connections. The gel 128 acts to encapsulate the leads and provide a stress relief for the leads during assembly. The gel 128 further provides an ionic contamination barrier for the integrated circuit die, and protects the die 120 from direct contact by the potting mixture 130. The relatively viscous silicone gel 128 is preferably composed of an ionically pure silicone gel mixture, such as HIPEC (Q1-4989 (Dow Coming). The gel mixture is composed of a resin and a hardener, preferably mixed as 10 parts resin and 1 part hardener. This minimizes the gel viscosity prior to curing, and maximizes its flexibility afar curing. Other suitable gels include XS-318340A (Amicon) and X3-6700 (Dow Corning).

A potting mixture 130 is used to fill the dam member 126. The potting mixture 130 provides rigidity and protection for the package. The potting mixture 130 is preferably a low viscosity epoxy mixture which can flow readily into the cavity created by the dam member 126 and the backplane 124. A suitable potting mixture 130 is the semiconductor encapsulant ES4438 (Hysol Division, Dexter Corp., Industry, Calif.). A flame retardant potting mixture 130 such as ES4328 (Hysol) can be used. A variety of epoxies known to the art can also be used.

An alternate embodiment of the semiconductor device package of this invention 210 is shown in FIG. 2. The semiconductor device package 210 of FIG. 2 shows a "tape automated bonding" (TAB) embodiment of a device of this invention.

The semiconductor device package 210 includes a flexible substrate 212 having an upper patterned insulative layer 214, and a lower patterned conductive layer 216 including a plurality of electrical leads 217. Flexible substrates 212 which are appropriate for use herein are well known in the art and are discussed above with reference to substrate 112. Located above and connected to the flexible substrate 212 is the integrated circuit die 220. The integrated circuit die 220 is in turn connected to and enclosed by a rigid cover plate 232 which includes a dam wall 234 and a lid 236 portion. Located below and connected to the flexible substrate is the rigid backplane 224.

The lower patterned conductive layer 216 does not include a die attach pad when TAB is used. Rather, when the integrated circuit die 220 is electrically and mechanically connected using TAB techniques: a plurality of connective beads 222 are positioned between integrated circuit output locations on the integrated circuit die 220 and the electrical leads 217 of the flexible substrate 212 to provide an electrical connection. The outermost edges of the electrical leads are referred to as the "package leads" 217e, and these provide the connection between the completed integrated circuit chip package and the environment in which the integrated circuit chip finds its ultimate use.

As noted above, the integrated circuit die 220 is connected to and enclosed by a rigid cover plate 232 which includes a dam wall 234 and a lid 236 portion. The dam wall 234 and a lid 236 can be a single unitary construction, or they can be made separately. They can be be made of similar or dissimilar materials. Materials which are appropriate for use include those discussed above in reference to the dam member 126.

The integrated circuit die 220 is affixed to the inner surface of the lid 236 portion of the rigid cover plate 232 using, for example, a metal-filled epoxy resin 238. The rigid cover plate 232 is then affixed to the flexible substrate 212 using an adhesive such as a B-stage adhesive, such as RT-4B (RJR Polymers).

The rigid backplane 224 is affixed to the flexible substrate 212 using an adhesive such as a B-stage adhesive (not shown). As discussed above, the rigid backplane 224 can be made of a rigid ceramic, or plastic. The rigid backplane 224 additionally may consist of an insulation layer 242, adhesive 241 and a conductive layer 244. For example, the rigid lower protective layer 224 can provide an insulating layer 242 proximate to the lead layer, and a signal plane layer electrical ground layer or power plane layer 244 distal to the lead layer. If the rigid backplane 224 functions as a signal plane, Found plane, power plane, or the like, and requires electrical connection to fie integrated circuit, backplane leads (not shown) are connected as desired.

A potting mixture can be used to fill the cavity 230 enclosed by the rigid cover plate 232. The potting mixture, if present, provides rigidity and/or protection for the package. The potting mixture is preferably a low viscosity epoxy mixture which can flow readily into the cavity 230 defined by the rigid cover plate 232 and the backplane 224. A suitable potting mixture is the semiconductor encapsulant ES4438 (Hysol). A flame retardant potting mixture such as ES4328 (Hysol) can be used. A variety of epoxies known to the art can also be used. Silicone gel such as Q1-4939, described above, can also be used as a potting mixture. Alternatively, the cavity 230 defined by the rigid cover plate 232 and the backplane 224 can be left empty, as shown, or partially filled by a potting mixture.

When a potting mixture is used to fill the cavity 230 defined by the rigid cover plate 232 and the backplane 224, one or more fill aperture(s) 240 is present. The fill aperture 240 provides access to the interior of the cavity defined by the rigid cover plate 232 and the backplane 224, and permits the introduction of the potting mixture. The fill aperture 240 can be sealed subsequent to the introduction of the potting mixture, or the potting mixture can act as the sealing agent.

Figure 3:
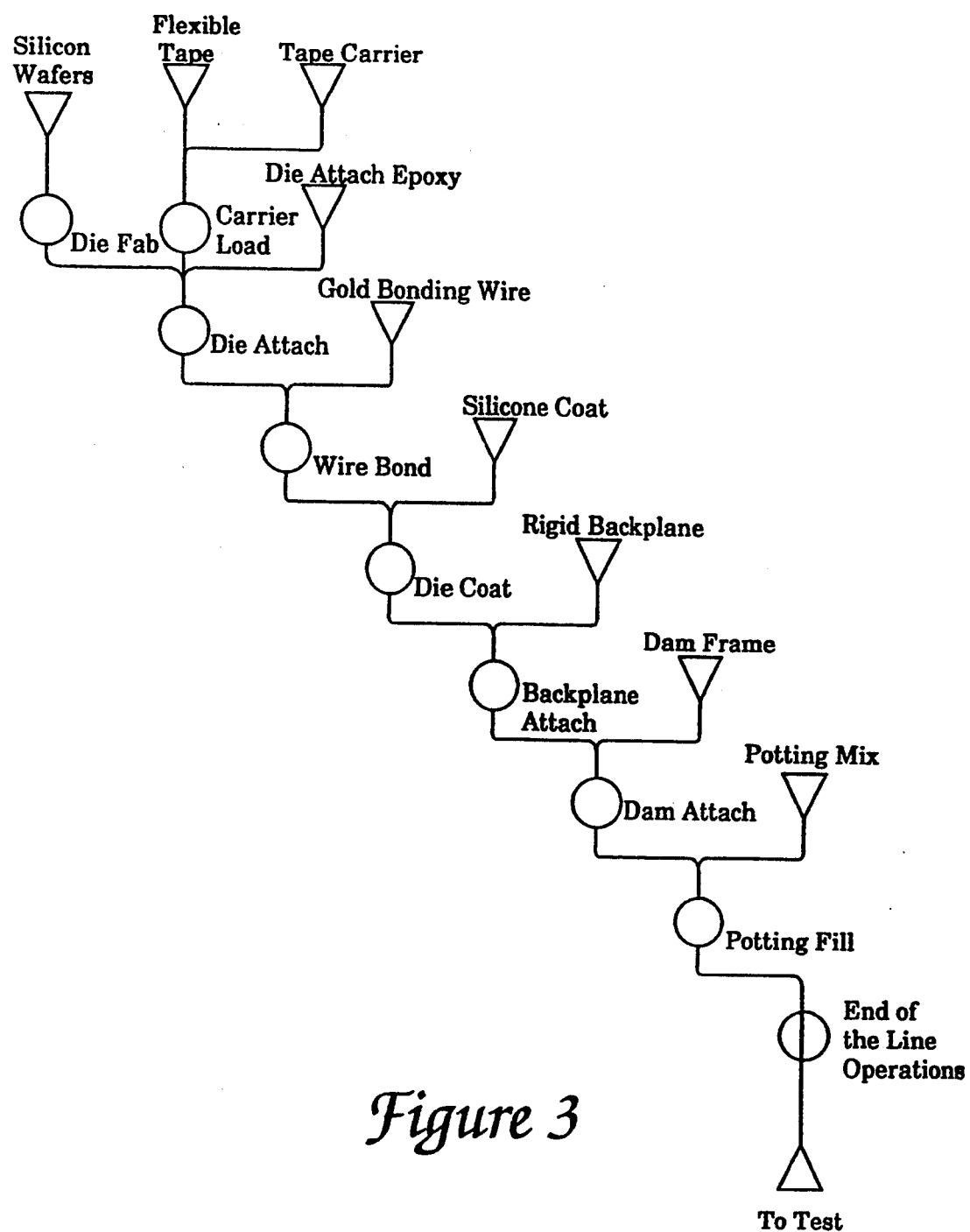
FIG. 3 is a flowchart showing the various steps which are used to make a wirebonded integrated circuit package of this invention.

FIG. 3 shows a flowchart describing the manufacture of a wirebonded semiconductor device package of this invention. Triangular markers refer to elements which are used or which become part of the completed package. Circular markers refer to process steps, and numbers refer to the structures shown in FIG. 1. While this flowchart provides a linear, step-by-step procedure for the production of an integrated circuit package of this invention, it will be understood that the given procedures can be varied somewhat. Such variations will be apparent to one skilled in the art. The flowchart is provided for purposes of illustration, not for purposes of limitation.

An appropriate flexible substrate tape 112 is designed, and either manufactured or purchased. In a preferred embodiment, the upper insulative layer 114 is made to conform to the shape of standard photographic film stock. Perforations along the edge of the film stock allow easy automation and handling of the flexible tape substrate 112. The lower patterned conductive layer 116 is designed to have a die attach pad 118.

The flexible substrate tape 112 is spot-welded to a tape carrier (not shown). The tape carrier acts to short the outer ends of the leads, and thus to facilitate electroplating. (After completion of the manufacturing process the integrated circuit package device assembly is excised from the tape carrier, which does not form any part of the ultimate semiconductor device assembly.) The tape carrier and and flexible substrate are joined in a carrier load step.

A silicon wafer is processed to form an integrated circuit die 120. In the die attach step, the integrated circuit die 120 is attached to the carrier using an epoxy. The epoxy is then allowed to cure. Gold wire 122 is then used in a wire bond process to attach the integrated circuit die 120 to the leads 117 of the flexible substrate tape 112 to provide the electrical connection between the integrated circuit die 120 and the package leads 117, allowing the integrated circuit die to communicate electrically with its environment.

The integrated circuit die 120 and wires 122 are coated with a silicon gel 128 in a die coat process. The silicon gel 128 is then allowed to cure.

A rigid backplane 124 is made or purchased, and is attached to the surface of the flexible tape 112 opposite the integrated circuit die 120. In the backplane attach step, the backplane 124 is covered with an epoxy, and attached to the flexible tape 112. The epoxy is then allowed to cure.

A dam 126 is made or purchased, and is attached to the flexible tape 112 such that it surrounds at least the periphery of the integrated circuit die 120 in the dam attach step. An epoxy is used to attach the dam 126 in the dam attach step. The epoxy is then allowed to cure.

A potting mixture 130 is applied within the dam 126. The potting mixture is allowed to cure and, along with the dam 126, fores the upper rigid protective layer. This is the final step in the manufacture of the package 110.

After package assembly, the package 110 may be marked, for example by laser or ink, generally indicating plant and week of manufacture, as well as designations of the source and type of integrated circuit die(s) contained within the package.

The tape carrier is then excised From the package. In some packages, a peripheral portion of the flexible substrate 112 is also removed with the tape carrier. In an optional step, the integrated circuit device package assembly can be mounted in a plastic carrier. Alternatively the device assembly can be done entirely within a plastic carrier. Such plastic carriers are well known in the art and can be purchased, for example, From Camrex Horizons, Inc. (Fremont, Calif.), and from Yamaichi Electronics (Japan). The plastic carrier provides protection for the semiconductor device package. When the semiconductor device package is complete it is sent to quality control operations for testing of the package and the enclosed integrated circuit device.

Figure 4:
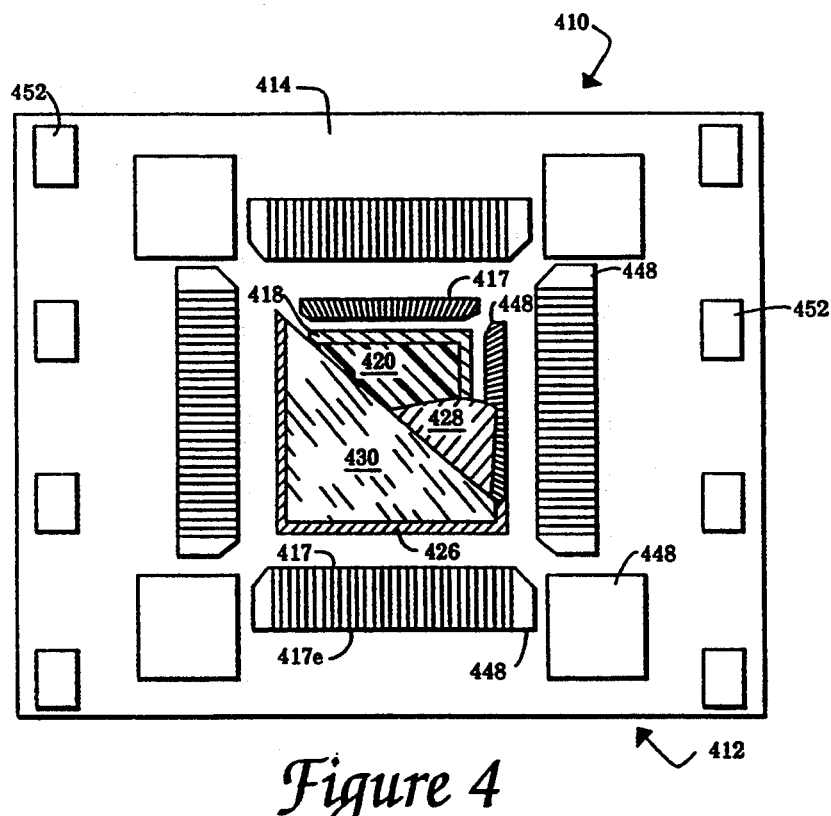
FIG. 4 shows a partially cut away top view of a wirebond integrated circuit package of this invention.

FIG. 4 shows a cutaway view of the upper surface of one embodiment of a completed semiconductor device package 410. As shown, the flexible substrate 412 includes an upper patterned insulative layer 414, as described above for substrates 114 and 214. Cutouts 448, or voids, are present in the upper patterned insulative layer 414 and provide conductive regions where the conductive leads 417 of the lower patterned conductive layer are accessible. The outer (perimeter) ends of the conductive leads 417 provide the package leads 417e. The package leads 417e are exposed through the outermost cutouts 448.

A dam member 426 and spotting mixture 430 are each shown cut away in FIG. 4 to reveal a silicon gel 428. The layer of silicone gel 428 is shown cut away in FIG. 4 to expose part of an integrated circuit die 420, which is attached to a die attach pad 418, present beneath the integrated circuit die 420. The thin conductive wires which connect the integrated circuit die 420 to the conductive leads 417 are not shown.

Along two of the edges of the semiconductor device package are regular perforations 452. These perforations 452 are artifacts of the use of photographic film stock as the upper insulative layer 414.

Figure 5:
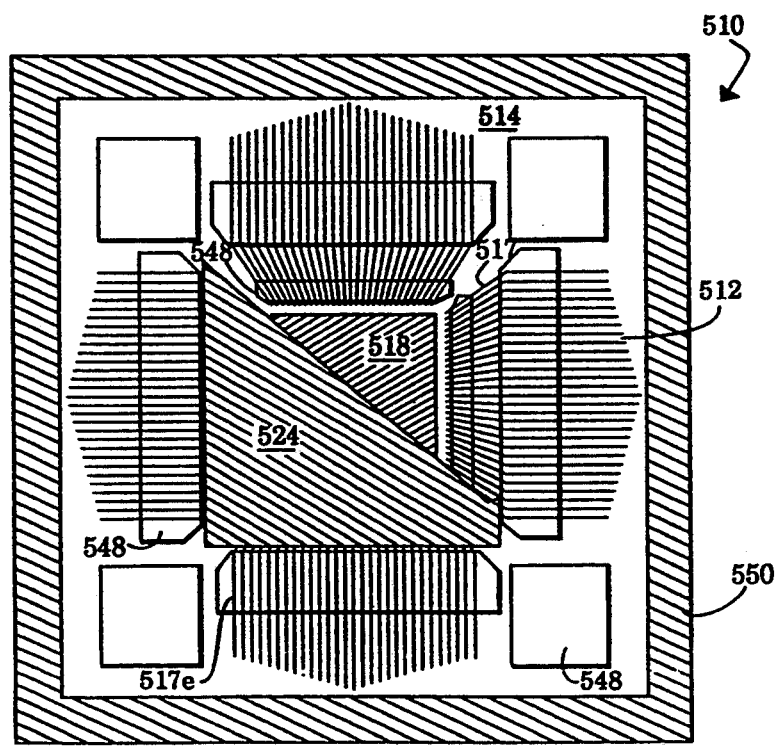
FIG. 5 shows a partially cut away bottom view of a wirebond integrated circuit package of this invention.

FIG. 5 shows a cutaway view of the lower surface of a completed semiconductor device package 510 which includes a plastic carrier 550. As shown, the flexible substrate 512 includes an upper patterned insulative layer 514, such as described above. Cutouts 548, or voids, which are present in the upper patterned insulative layer 514 are visible behind the conductive leads 517. The outer (perimeter) ends of the conductive leads 517 provide the package leads 517e. The rigid backplane 514 is shown partially cut away to reveal a die attach pad 518 on which an integrated circuit die 520 is mounted.

The complete integrated circuit package of this invention is suitable for storage, shipping, and the like. When it is time for the integrated circuit to be placed within its environment of use, further assembly steps may be required. When a plastic carrier is present, the carrier must be excised from the remainder of the integrated circuit package. If excess areas of the flexible substrate are present, the excess can be excised. Similarly, if multiple integrated circuits are present within one integrated circuit package, it may be necessary or desirable to separate the integrated circuits into separate units. The individual integrated circuits are then placed onto a PC board (for example) and electrically connected to the remainder of the board, for example by soldering. The package leads can be manipulated, soldered, bent, or otherwise processed to provide board leads which connect the integrated circuit chip to the PC board. The PC board is then cleaned and tested in any suitable manner.

While the invention has been described in connection with several exemplary embodiments, it will be understood that many modifications will be apparent to those of ordinary skill in the art in light of the above disclosure. Such modifications may include using substitute materials, smaller or greater dimensions, more than one die in a package, different types of encapsulated integrated circuit devices, a variety of different shapes for conductors, insulators and so forth, to achieve substantially the same results in substantially the same way. Reference to the following claims should be made to determine the scope of the claimed invention.

I claim:

1. A package for a semiconductor device comprising:
   (a) a flexible substrate having an upper patterned insulative layer and a lower patterned conductive layer laminated together, said conductive layer including a plurality of package leads;
   (b) a semiconductor device attached to the flexible substrate;
   (c) a plurality of electrical leads providing electrical connections between the semiconductor device and the package leads;
   (d) a rigid upper protective insulating and moisture resistant layer disposed around said electrical leads and the semiconductor device, and attached to said flexible substrate; and
   (e) a rigid lower protective insulating and moisture resistant layer attached to said flexible substrate and opposite the upper protective layer, said lower protective layer proximate to and substantially covering said flexible substrate conductive layer except the package leads, wherein the rigid upper protective layer and the rigid lower protective layer act to substantially enclose the semiconductor device and prevent moisture penetration therein.

2. The package of claim 1 wherein the lower patterned conductive layer further comprises a die attach pad.

3. The package of claim 2 wherein the plurality of electrical leads providing electrical connections between the integrated circuit die and the package leads are formed by wire bonding.

4. The package of claim 1 wherein the plurality of electrical leads providing electrical connections between the integrated circuit die and the package leads are formed by tape automated bonding.

5. The package of claim 1 wherein the rigid lower protective layer is made of a material selected from the group consisting of rigid ceramic, glass, plastic, and combinations thereof.

6. The semiconductor device package of claim 1 wherein the lower patterned conductive layer further comprises a semiconductor device attach pad supported between the upper film layer and the lower rigid protective layer for supporting the semiconductor device.

7. The semiconductor device package of claim 6 wherein the plurality of electrical leads providing electrical connections between the integrated circuit and the leads are formed at least in part by wire bonding.

8. The semiconductor device package of claim 1 wherein the plurality of electrical leads providing electrical connections between the semiconductor device and the package leads are formed at least in part by tape automated bonding.

9. The package of claim 1, wherein the semiconductor device is an integrated circuit die.

10. The package of claim 1, wherein the semiconductor device is a transistor.

11. The package of claim 1, wherein the semiconductor device is a plurality of transistors.

12. A method of producing a semiconductor package comprising:
   (a) providing a flexible laminated substrate having (i) an upper patterned insulative layer; and (ii) a lower patterned conductive layer including a plurality of package leads;
   (b) attaching a semiconductor device to the flexible substrate and connecting a plurality of electrical leads to make electrical connections between the semiconductor device and the package leads;
   (c) attaching a rigid upper protective insulating and moisture resistant layer around said electrical leads and semiconductor device at least partially surrounding the upper insulative layer, electrical leads and semiconductor device; and
   (d) attaching a rigid lower protective insulating and moisture resistant layer opposite the upper protective layer,
   wherein the rigid upper protective layer and the rigid lower protective layer act to substantially enclose the semiconductor device and prevent moisture penetration therein.

* * * * *